United States Patent [19]
Pan et al.

[11] Patent Number: 6,100,156
[45] Date of Patent: *Aug. 8, 2000

[54] METHOD FOR FORMING A CONTACT INTERMEDIATE TWO ADJACENT ELECTRICAL COMPONENTS

[75] Inventors: Pai-Hung Pan; Thomas Arthur Figura, both of Boise, Id.

[73] Assignee: Micron Technology, Inc., Boise, Id.

[ * ] Notice: This patent is subject to a terminal disclaimer.

[21] Appl. No.: 09/096,727

[22] Filed: Jun. 11, 1998

Related U.S. Application Data

[63] Continuation of application No. 08/523,072, Sep. 1, 1995, Pat. No. 5,776,815.

[51] Int. Cl.[7] .................................................. H01L 21/20
[52] U.S. Cl. ..................... 438/396; 438/253; 438/254; 438/397
[58] Field of Search .................................. 438/396, 253, 438/254, 397

[56] References Cited

U.S. PATENT DOCUMENTS

| | | | |
|---|---|---|---|
| 5,206,183 | 4/1993 | Dennison | 437/47 |
| 5,338,700 | 8/1994 | Dennison et al. | 437/60 |
| 5,488,011 | 1/1996 | Figura et al. | 437/60 |
| 5,498,562 | 3/1996 | Dennison et al. | 437/52 |
| 5,500,384 | 3/1996 | Melzner | 437/60 |
| 5,580,811 | 12/1996 | Kim | 437/52 |
| 5,654,236 | 8/1997 | Kasai | 438/639 |

Primary Examiner—John F. Niebling
Assistant Examiner—Lynne A. Gurley
Attorney, Agent, or Firm—Wells, St. John, Roberts, Gregory & Matkin

[57] ABSTRACT

A method for forming a contact intermediate adjacent electrical components including, providing a node to which electrical connections are desired and which is located between two electrical components; providing oxidation conditions effective to grow an oxide cap on the outer portions of each of the adjacent electric components; exposing a given target area between the adjacent electrical components, the given target area being larger than what would otherwise exist if the oxide caps are not present; selectively removing material from within the target area while simultaneously protecting the adjacent electrical components from the selective removal conditions; selectively removing material from the target area thereby exposing the underlying node; and providing an electrically conductive material within the target area and which is disposed in electrical contact with the node.

27 Claims, 14 Drawing Sheets

FIG. III

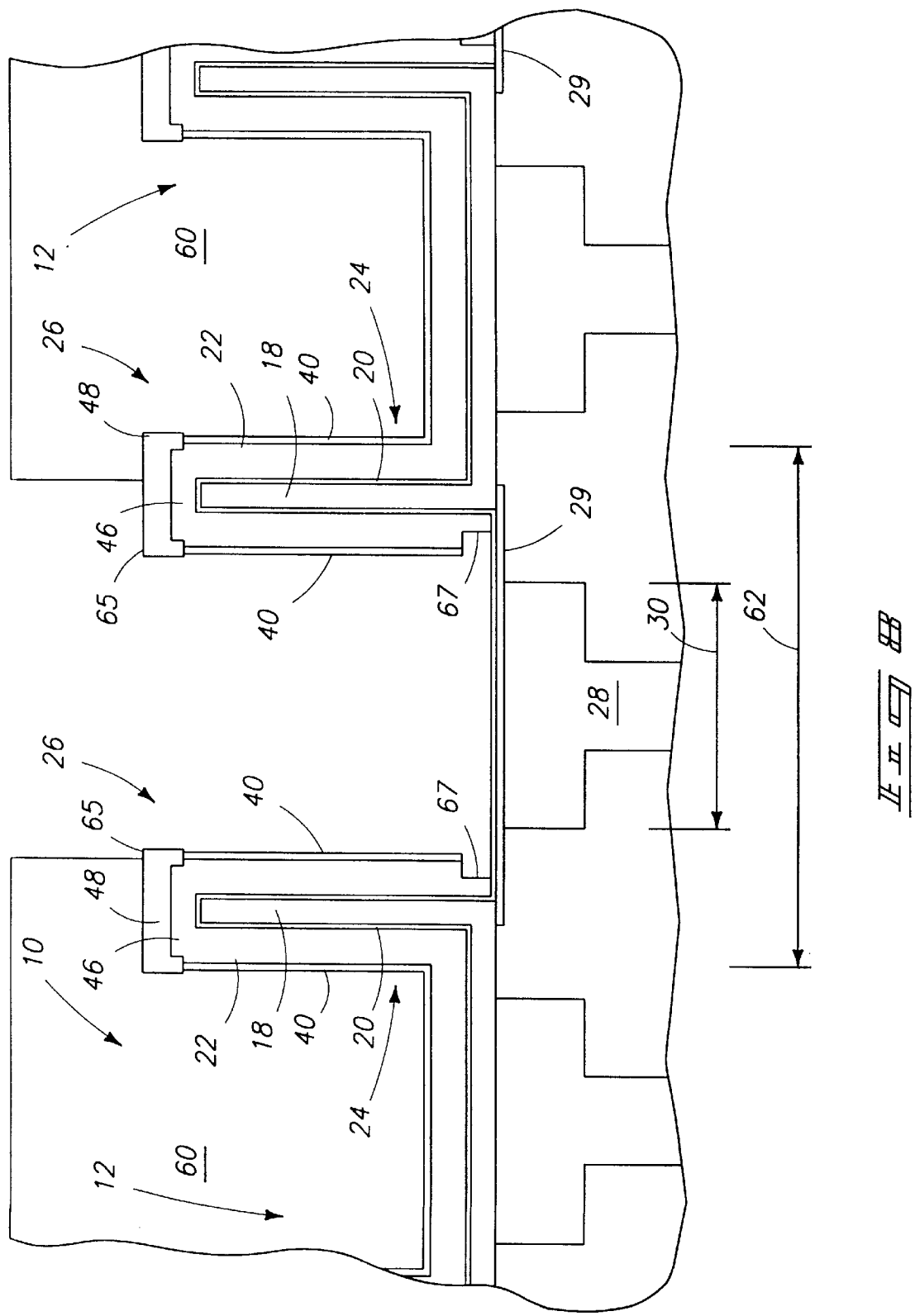

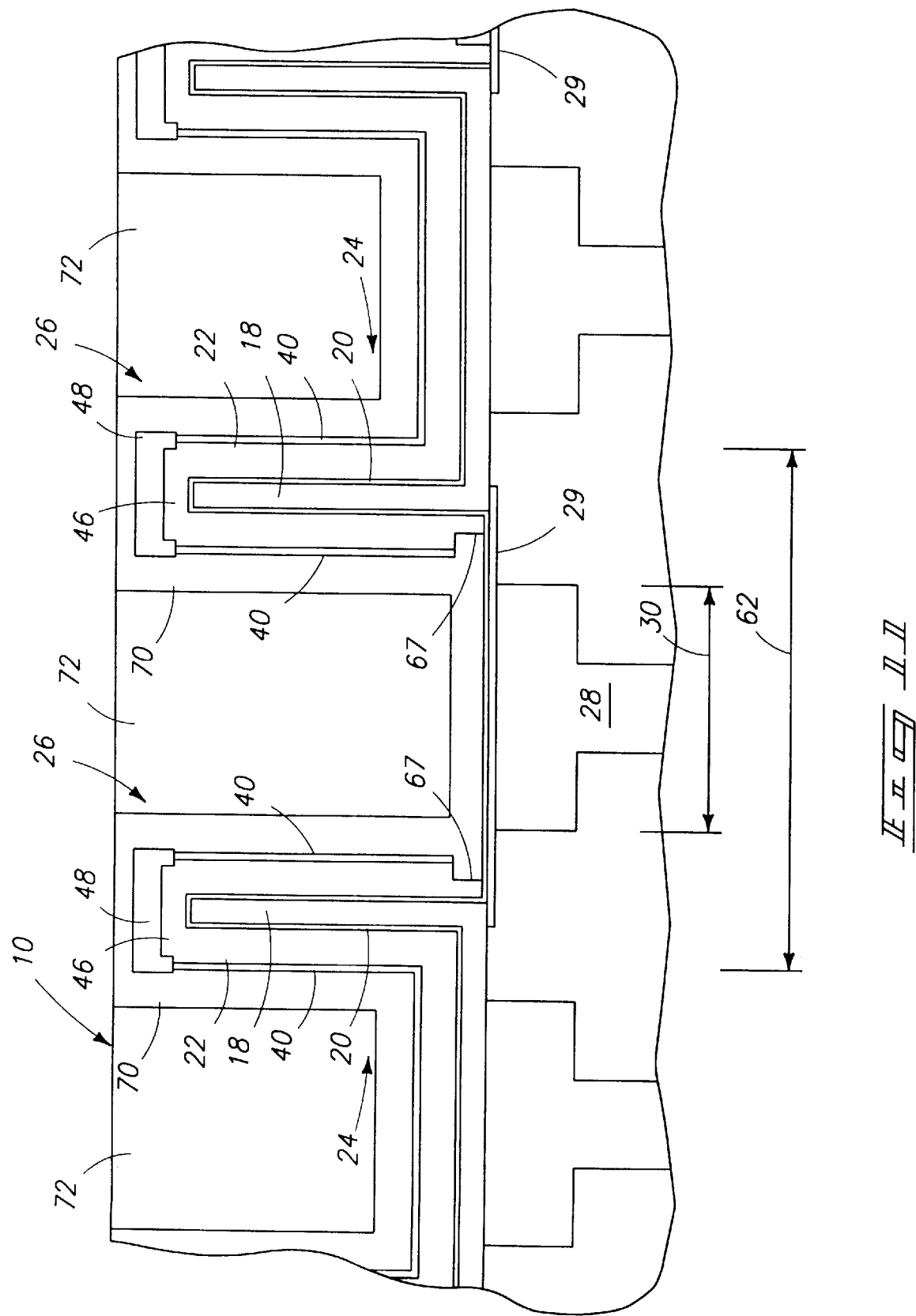

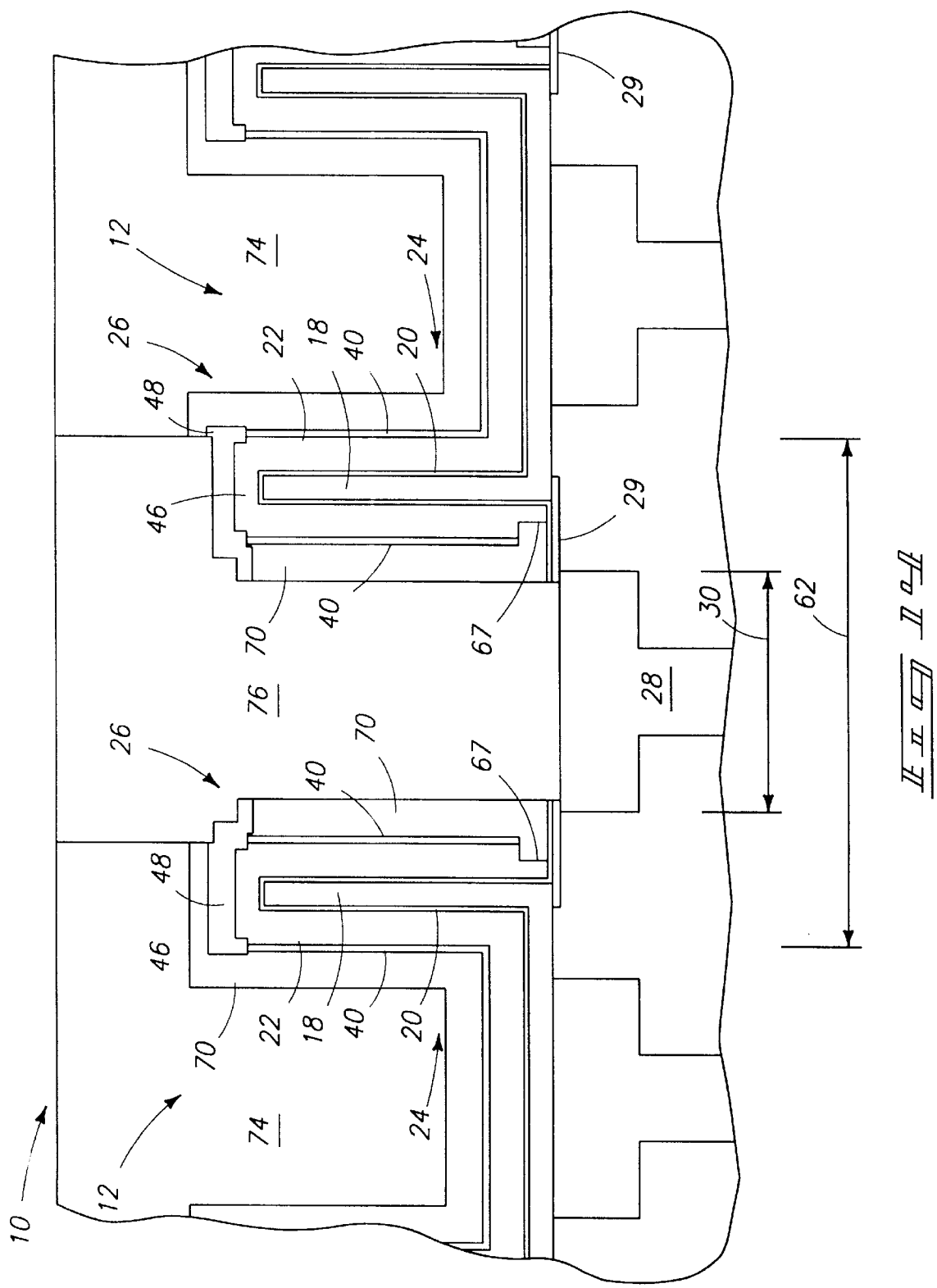

METHOD FOR FORMING A CONTACT INTERMEDIATE TWO ADJACENT ELECTRICAL COMPONENTS

RELATED PATENT DATA

This application resulted from a continuation application of U.S. patent application Ser. No. 08/523,072 filed Sep. 1, 1995, now U.S. Pat. No. 5,776,815.

TECHNICAL FIELD

This invention relates generally to the formation of a contact intermediate two adjacent electrical components.

BACKGROUND OF THE INVENTION

DRAM arrays typically include adjacent capacitors between which isolated electrical contact must be made to a transistor for a DRAM bit line. Such contact is typically provided by use of a photoresist masking step which must be critically aligned relative to the adjacent capacitors to assure that the bit contact and capacitors do not short. To allow for inevitable mask misalignment, the capacitors are typically spaced farther apart than would otherwise by required if risk of photoresist mask misalignment were not an issue. However, the added space typically provided for mask misalignment undesirably defeats the goal of maximizing circuit density.

Accordingly, needs remain for increasing the target area for the contact etch between adjacent capacitors without consuming precious substrate area. Although the invention arose from problems associated with forming a bit line contact between adjacent capacitors, the artisan will appreciate applicability of the invention to other aspects of semiconductor wafer processing where contacts are formed intermediate to adjacent electrical components.

BRIEF DESCRIPTION OF THE DRAWINGS

Preferred embodiments of the invention are described below with reference to the following accompanying drawings.

FIG. 8 is a diagrammatic section of that shown in FIG. 1, and which illustrates a processing step subsequent to that shown in FIG. 7.

FIG. 9 is a diagrammatic section of that shown in FIG. 1, and which illustrates a processing step subsequent to that shown by FIG. 8.

FIG. 13 is a diagrammatic section of that shown in FIG. 1, and which illustrates a processing step subsequent to that shown by FIG. 12.

FIG. 14 is a diagrammatic section of that shown in FIG. 1, and which illustrates a processing step subsequent to that shown by FIG. 13.

DETAILED DESCRIPTION OF THE PREFERRED EMBODIMENTS

Figure 1:
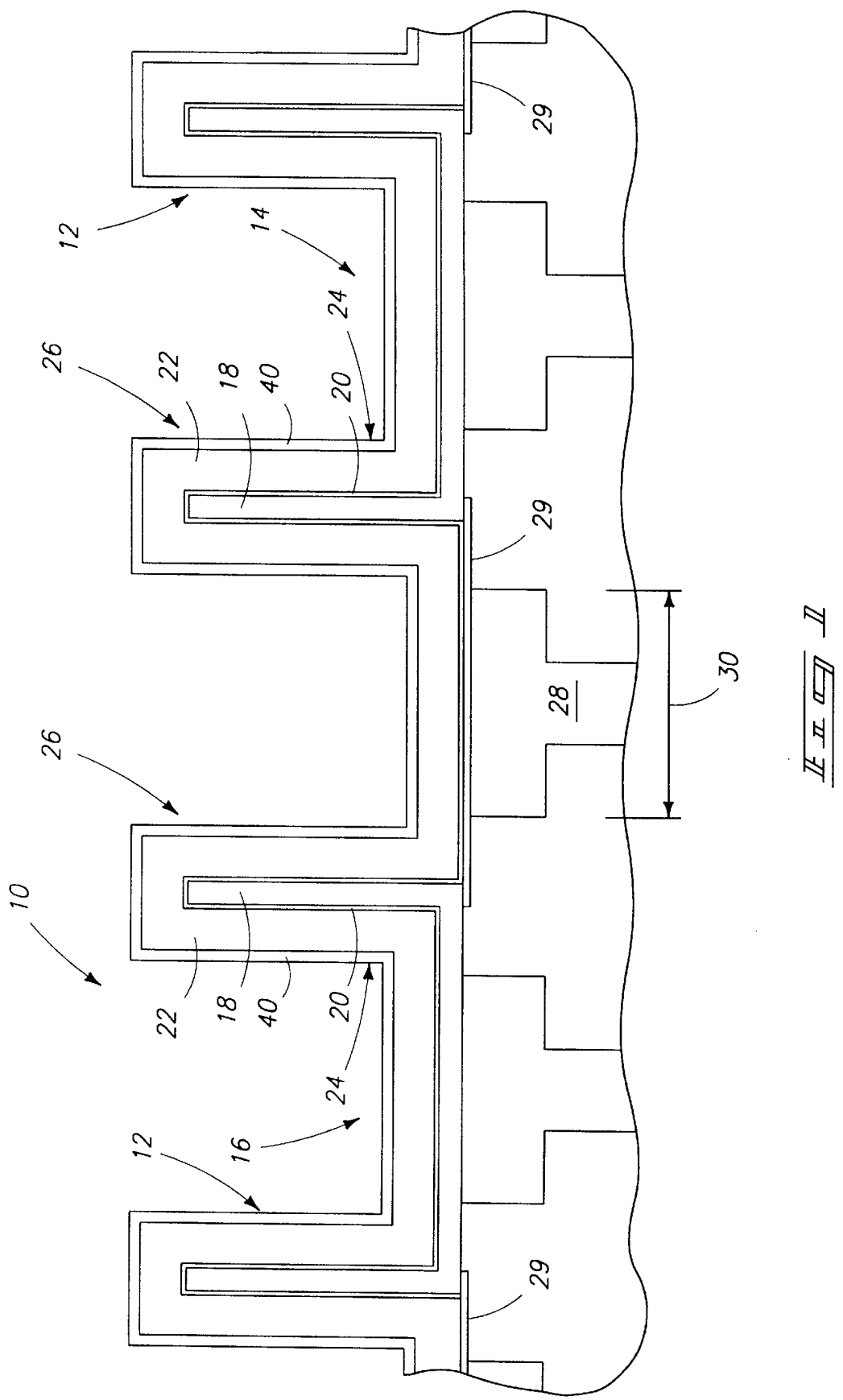
FIG. 1 is a diagrammatic section of a semiconductor wafer shown at one processing step in accordance with the present invention.

This disclosure of the invention is submitted in furtherance of the constitutional purposes of the U.S. Patent Laws "to promote the progress of science and useful arts" (Article 1, Section 8).

In accordance with the broadest aspects of the present invention, a method for forming a contact intermediate to adjacent electrical components includes the following steps:

providing a node between two adjacent electrical components, the node having a first surface area to which electrical connection is to be made;

protecting the adjacent electrical components from substantial degradation in a manner which defines a given target area between the electrical components having a second surface area which is at least twice as large as the first surface area;

removing material from the target area thereby exposing the node; and providing an electrically conductive material within the target area and which is in electrical contact with the node.

In accordance with another aspect of the invention, the preferred method includes the following steps:

providing a bit node to which electrical connection is desired;

providing a pair of adjacent capacitors which are disposed in spaced relationship one to another; the capacitors respectively comprising a storage node layer, a cell dielectric layer and a cell polysilicon layer; the individual capacitor layers defining a least two adjacent and upwardly projecting pillars each having an uppermost portion; one pillar being associated with one capacitor, and the other pillar being associated with the other capacitor; the cell polysilicon layer being common to the pair of capacitors and extending therebetween; and the bit node being positioned between the capacitors;

providing an oxidation barrier layer over the cell polysilicon layer;

providing a first masking layer over the oxidation barrier layer and thereafter removing only a portion of the first masking layer to expose the oxidation barrier layer on the uppermost portions of the two pillars;

removing the exposed oxidation barrier layer from the uppermost portions of the pillars to expose the underlying cell polysilicon layer on the uppermost portions of the pillars;

removing the first masking layer;

subjecting the exposed cell polysilicon layer to oxidation conditions effective to grow an oxide cap on each of the pillars;

providing a second masking layer to mask the capacitors and outwardly expose an area between the pillars on the adjacent capacitors, the oxide caps defining a given target area which is larger than would otherwise exist if the oxide caps were not present, the target area including the area between the individual pillars;

etching the oxidation barrier layer from within the target area;

etching the cell polysilicon layer within the target area and leaving the cell polysilicon layer material within the given target area outwardly exposed;

removing the second masking layer;

providing a conformal dielectric layer of a first dielectric material over the exposed polysilicon layer which is located within the target area;

providing a filling dielectric layer of a second dielectric material over the conformal dielectric layer, the second dielectric material being selectively etchable relative to the first dielectric material;

providing a third masking layer to mask the capacitors and outwardly expose the area between the capacitors, the oxide caps defining the given target area which is larger than would otherwise exist if the oxide caps were not present;

removing the first and second dielectric materials from within the target area to effectively outwardly expose the bit node while leaving the first dielectric material in covering relation relative to the cell polysilicon of the adjacent capacitors within the target area; and providing an electrically conductive material within the target area and which is in electrical contact with the bit node.

Referring now to FIG. 1, a semiconductor wafer is indicated generally by reference to the numeral 10. The wafer 10 has been provided with a pair of capacitors 12, and which include a first capacitor 14 and a second capacitor 16. The capacitors define electrical components which are disposed in a predetermined spaced relationship one to the other. The capacitors each have a storage node layer 18; a cell dielectric layer 20; and a cell conductive layer, that is, polysilicon layer 22. These layers define individual, adjacent upwardly projecting pillars 24, each having, an uppermost portion 26. It should be understood that one pillar 24 is associated with one of the capacitors 14 and the other pillar is associated with the adjacent capacitor 16. Further, the cell polysilicon layer 22 is common to the pair of capacitors 14 and 16, and extends therebetween. The cell polysilicon 22 has a preferred thickness dimension of about 500 to 1,000 Angstroms.

A bit node 28 is positioned between capacitors 14 and 16 and has a given first surface area which is indicated generally by the line labeled 30. A nitride layer 29 overlies the bit node 28. As noted above, the method of the present invention includes a step of protecting adjacent electrical components, such as capacitors 12, from substantial degradation. In the preferred embodiment, this step comprises providing an oxidation barrier layer 40 over the cell polysilicon layer 22. An example of an appropriate oxidation barrier layer 40 is silicon nitride which is deposited to a thickness of greater than about 100 Angstroms.

Figure 2:
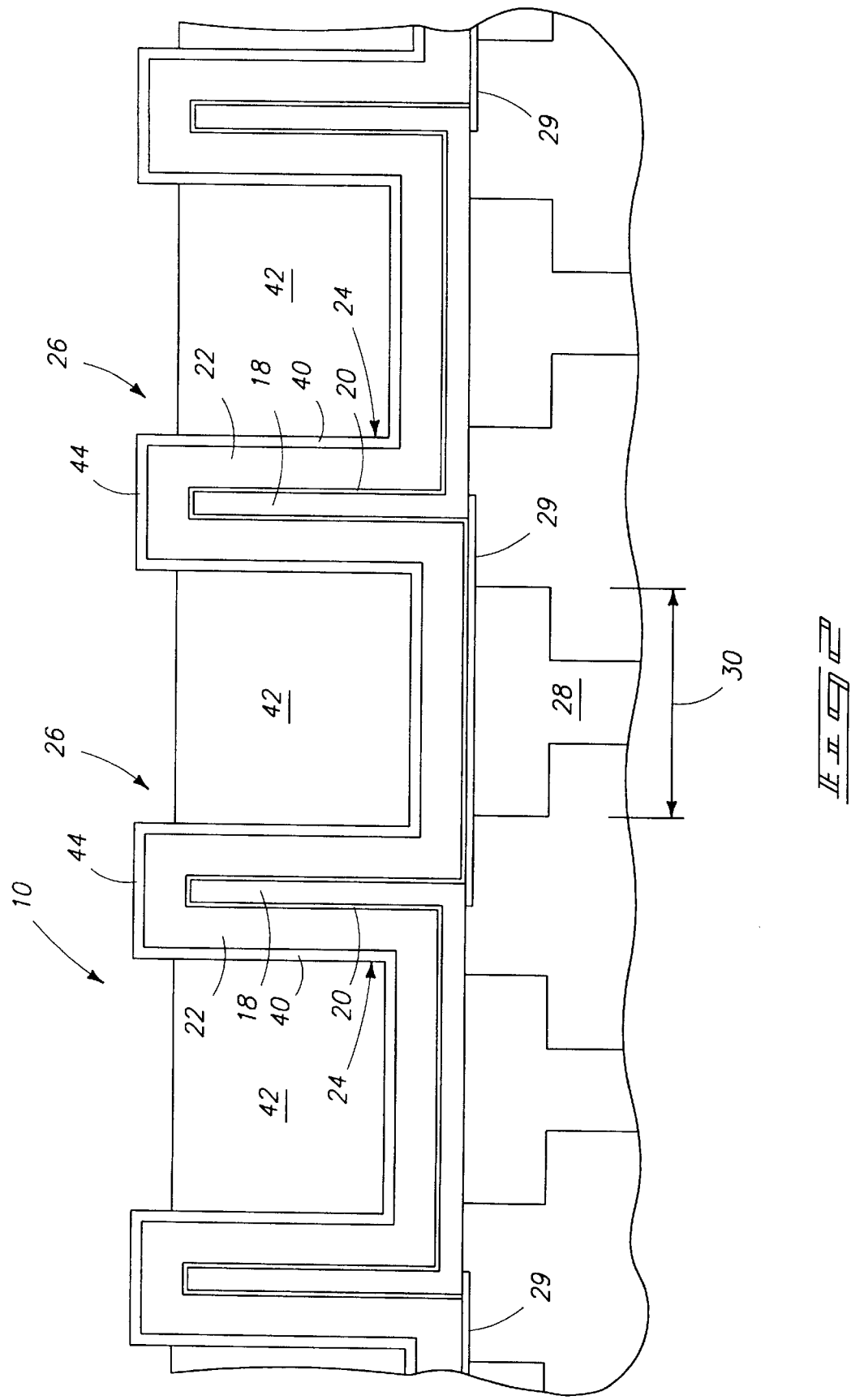
FIG. 2 is a diagrammatic section of that shown in FIG. 1 and which illustrates a processing step subsequent to that shown by FIG. 1.

Referring now to FIG. 2, a first masking layer 42 of photoresist or oxide is applied over the oxidation barrier layer 40. Thereafter, only a portion of the first masking layer is removed to define exposed oxidation barrier layer portions 44 which are located on the uppermost portions 26 of the individual pillars 24. The removal of the photoresist can be achieved by chemical mechanical polishing or by wet or dry etching.

Figure 3:
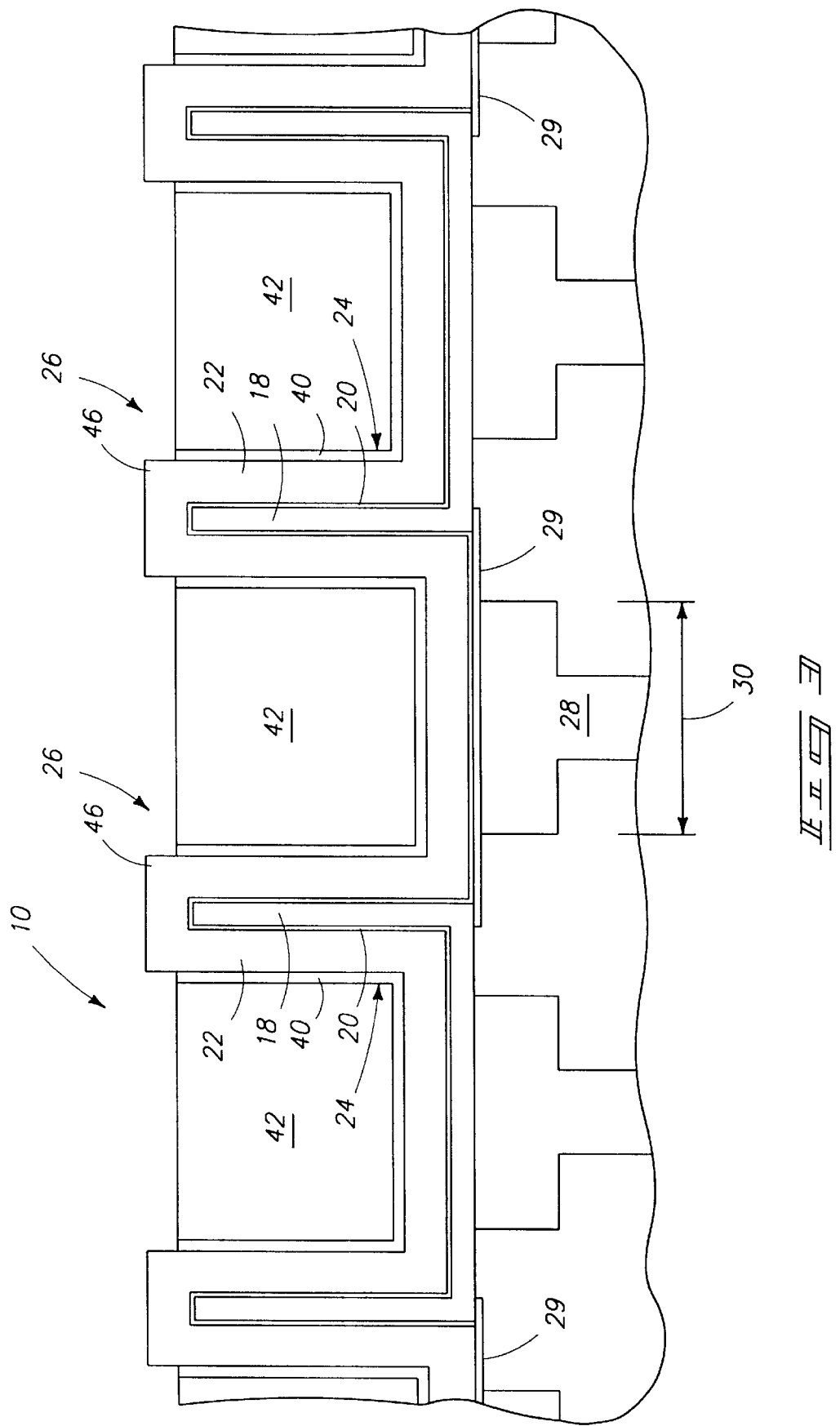
FIG. 3 is a diagrammatic section of that shown in FIG. 1, and which illustrates a processing step subsequent to that shown by FIG. 2.

Referring to FIG. 3, upon exposing the uppermost portions 26 of the pillars 24, the oxidation barrier layer portions 44 are removed therefrom to define exposed underlying cell polysilicon layer portions 46. Such can be accomplished by using an etch chemistry comprising $Cl_2$, $CF_4$, $CHF_3$, or by wet means, that is, for example, phosphoric acid.

Figure 4:
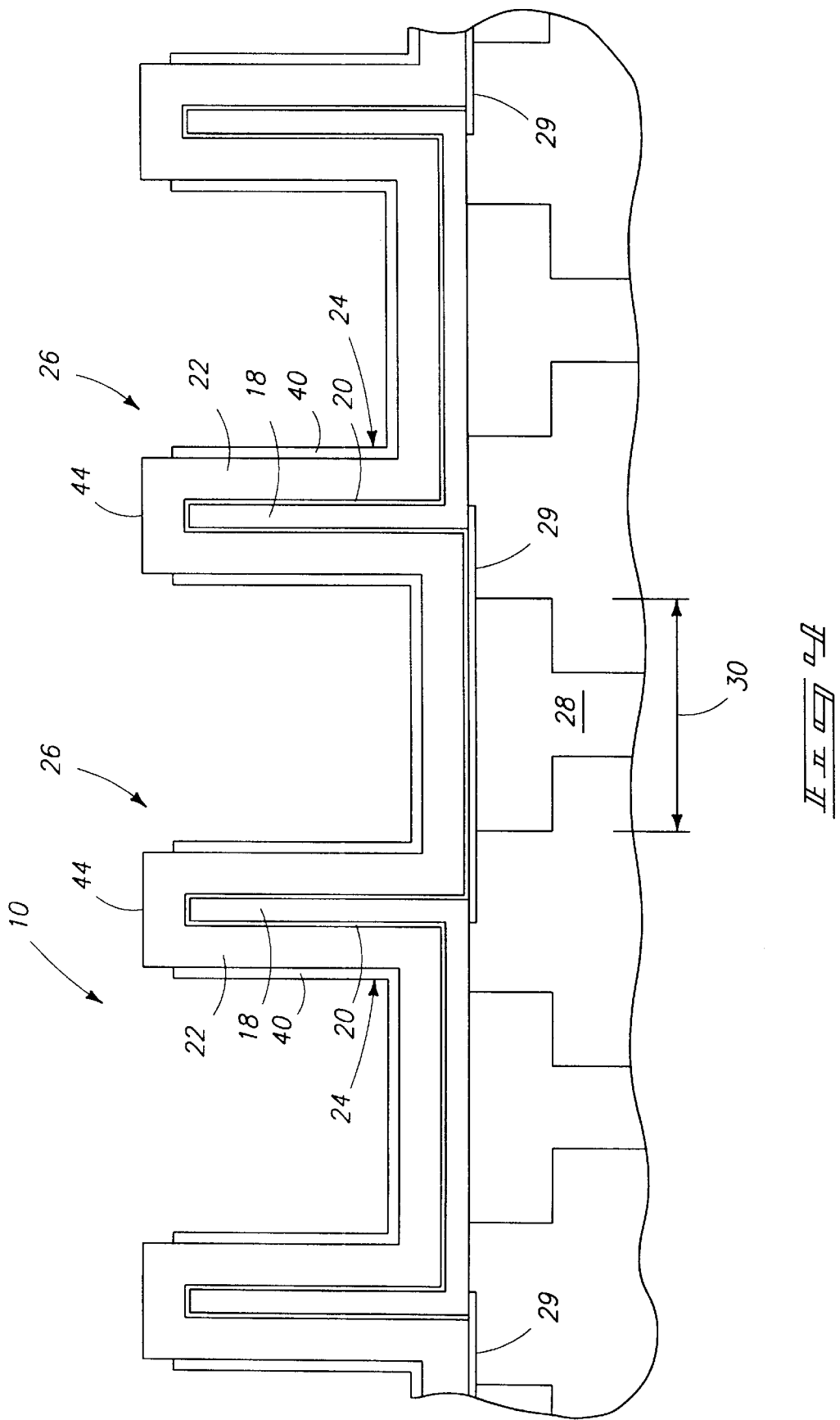
FIG. 4 is a diagrammatic section of that shown in FIG. 1, and which illustrates a processing step subsequent to that shown in FIG. 3.
Figure 5:
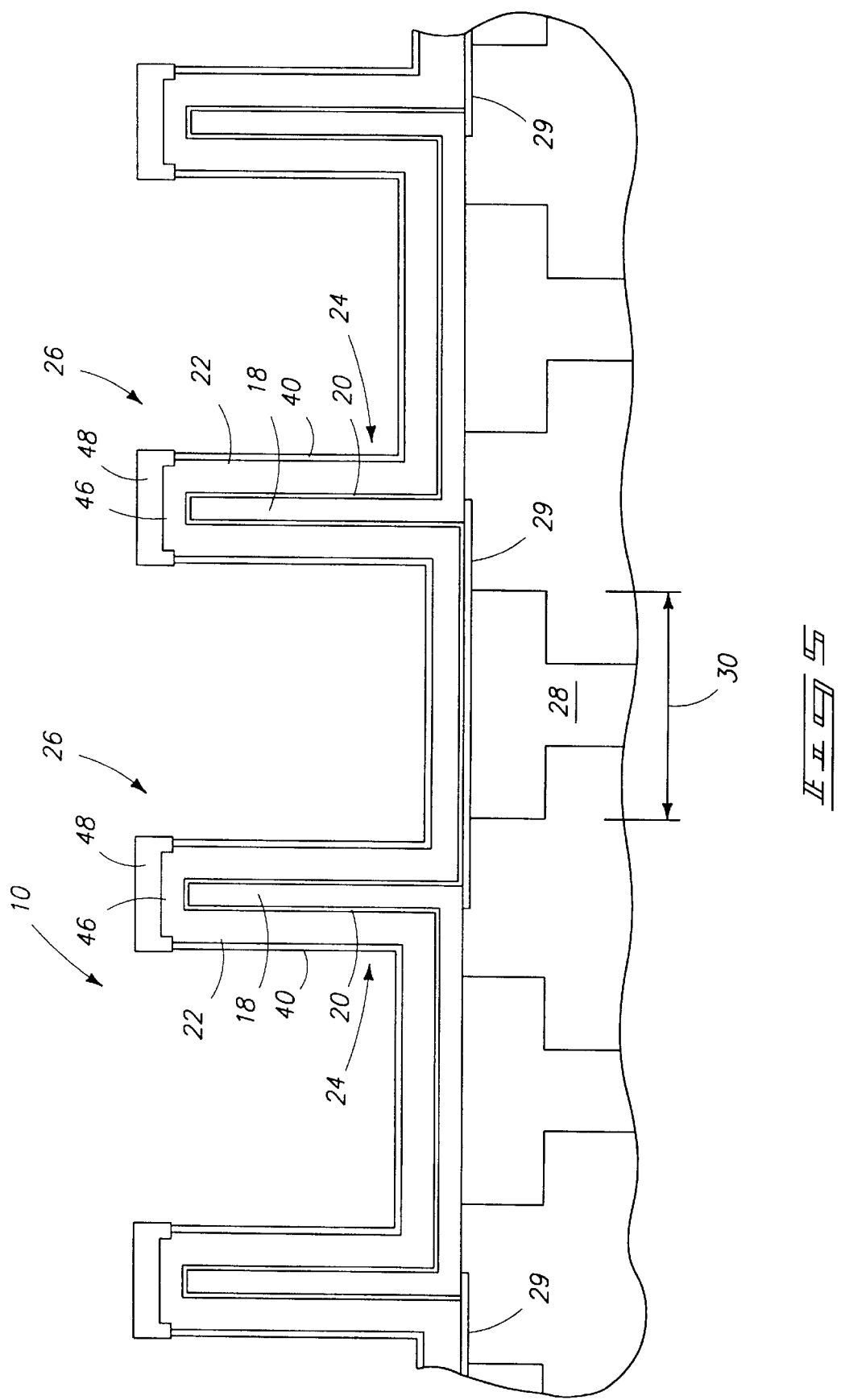
FIG. 5 is a diagrammatic section of that shown in FIG. 1, and which illustrates a processing step subsequent to that shown in FIG. 4.

Referring to FIGS. 4 and 5, the first masking layer 42 is removed and oxide caps 48 are grown on the exposed portions 46 of polysilicon layer 22. Oxide caps 48 can be grown by exposing the polysilicon layer to oxidation conditions. Such oxidation conditions could include, among others, exposing the cell polysilicon layer to a steam environment. The oxide caps are grown to a thickness of at least 300 Angstroms.

Figure 6:
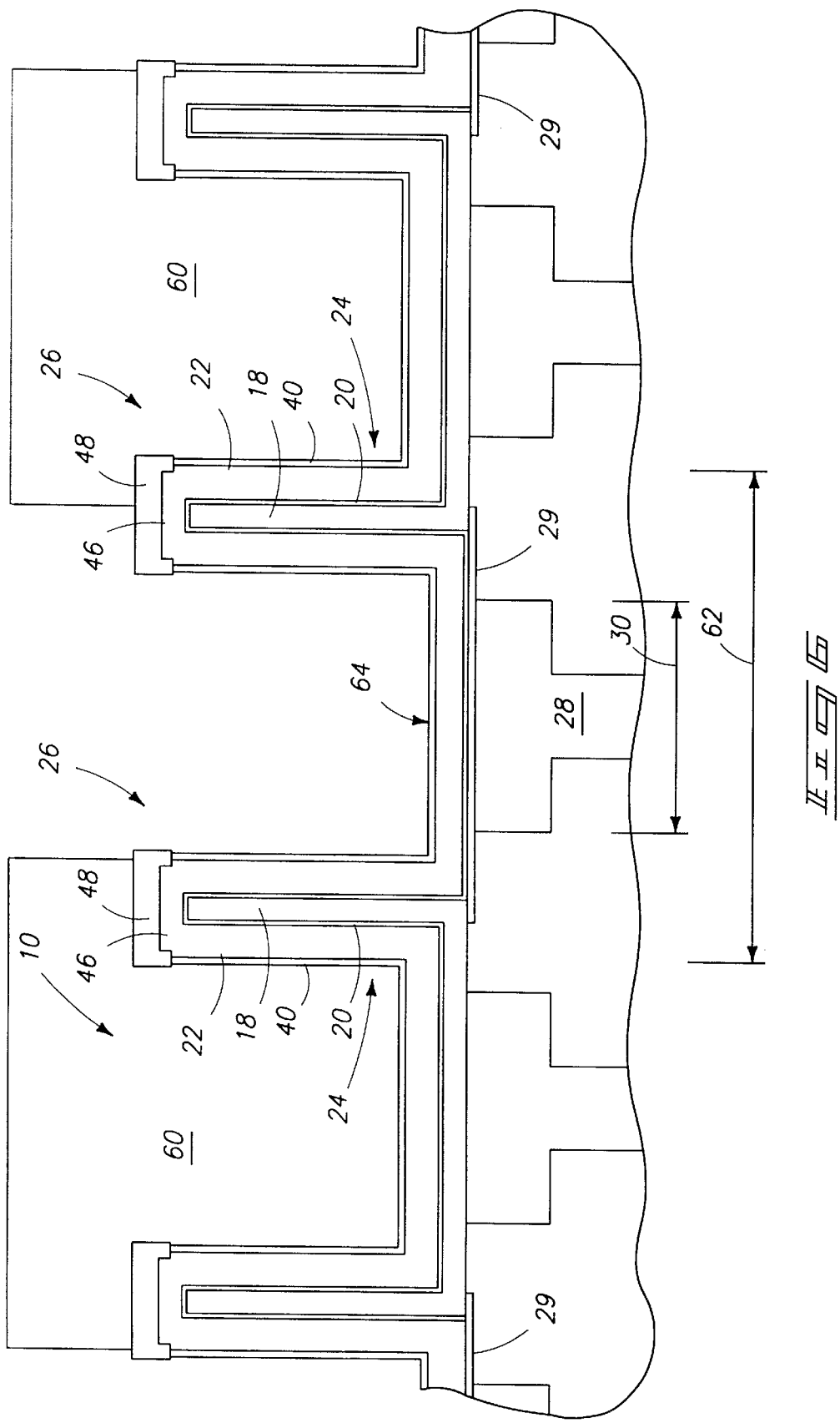
FIG. 6 is a diagrammatic section of that shown in FIG. 1, and which illustrates a processing step subsequent to that shown in FIG. 5.

Referring FIG. 6, protecting the adjacent electrical components from substantial degradation by means of caps 48 defines a given target area 62 between the electrical components having a second surface area which is at least 50% bigger than the first surface area 30. A second masking layer 60, preferably of photoresist, is applied and patterned as shown. This target area may be alternatively referred to as the second surface area, hereinafter. The second masking layer 60 masks the individual capacitors 14 and 16 respectively, and outwardly exposes the area labeled by the numeral 64 between the pillars 24 of the adjacent capacitors 14 and 16.

Figure 7:
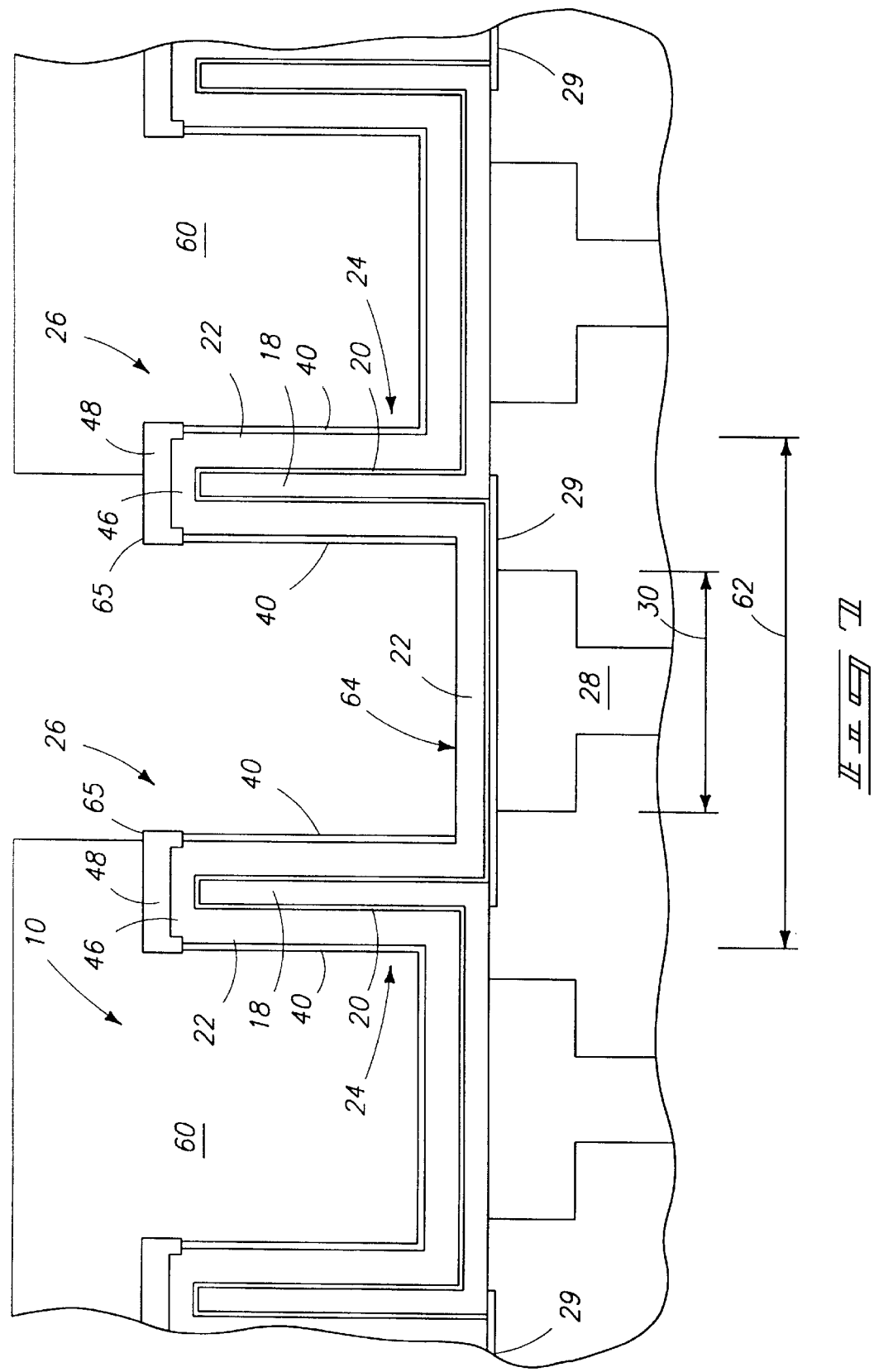
FIG. 7 is a diagrammatic section of that shown in FIG. 1, and which illustrates a processing step subsequent to that shown in FIG. 6.

Referring now to FIG. 7, an anisotropic etching process is utilized to etch the oxidation barrier layer 40 from within the given target area. The step of etching the oxidation barrier layer 40 from within the target area 62 preferably includes the use of an etching chemistry which selectively etches the oxidation barrier layer relative to the oxide caps 48 at a ratio of at least five to one (5:1). An example etch chemistry where layer 40 is $Si_3N_4$ is $CF_4$, $CHF_3$, and $Cl_2$.

Referring to FIG. 8, a selective etching chemistry is next utilized to etch the cell polysilicon layer 22 from within the given target area 62 to cut layer 22 and electrically separate or isolate capacitors 14 and 16 from the bit node contact area. Consequently, cell polysilicon layer 22 within the given target area 62 is outwardly exposed and recessed about 300–500 Angstroms at 67. The etching chemistry employed to remove exposed polysilicon of layer 22 from within the target area 62 preferably selectively etches polysilicon relative to the oxidation barrier layer 40 at a ratio of at least ten to one (10:1). An example etch chemistry includes $Cl_2$ and HBr mixture. Following completion of this etching, the second masking layer 60 is removed (FIG. 9).

Figure 10:
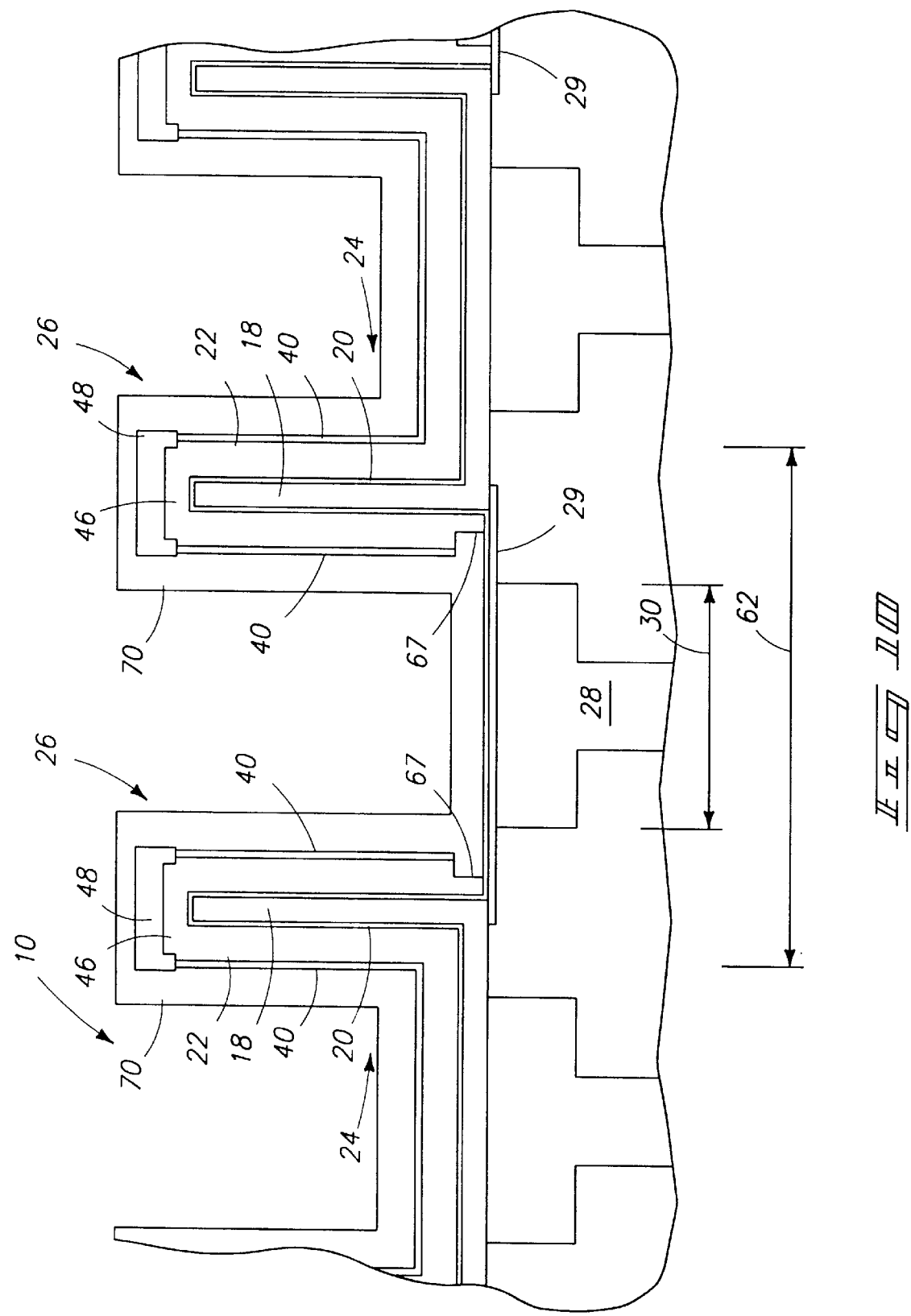
FIG. 10 is a diagrammatic section of that shown in FIG. 1, and which illustrates a processing step subsequent to that shown in FIG. 9.

Referring to FIG. 10, the method of the present invention further includes the step of providing and then removing material from the target area 62, thereby exposing the bit node 28. More specifically, this step preferably includes providing a conformal dielectric layer of a first dielectric material 70 over the exposed cell polysilicon 22 which is located in the target area 62. In the preferred embodiment, this first dielectric layer is composed of silicon nitride which is deposited to a thickness of about 500 to about 900 Angstroms.

Figure 11:
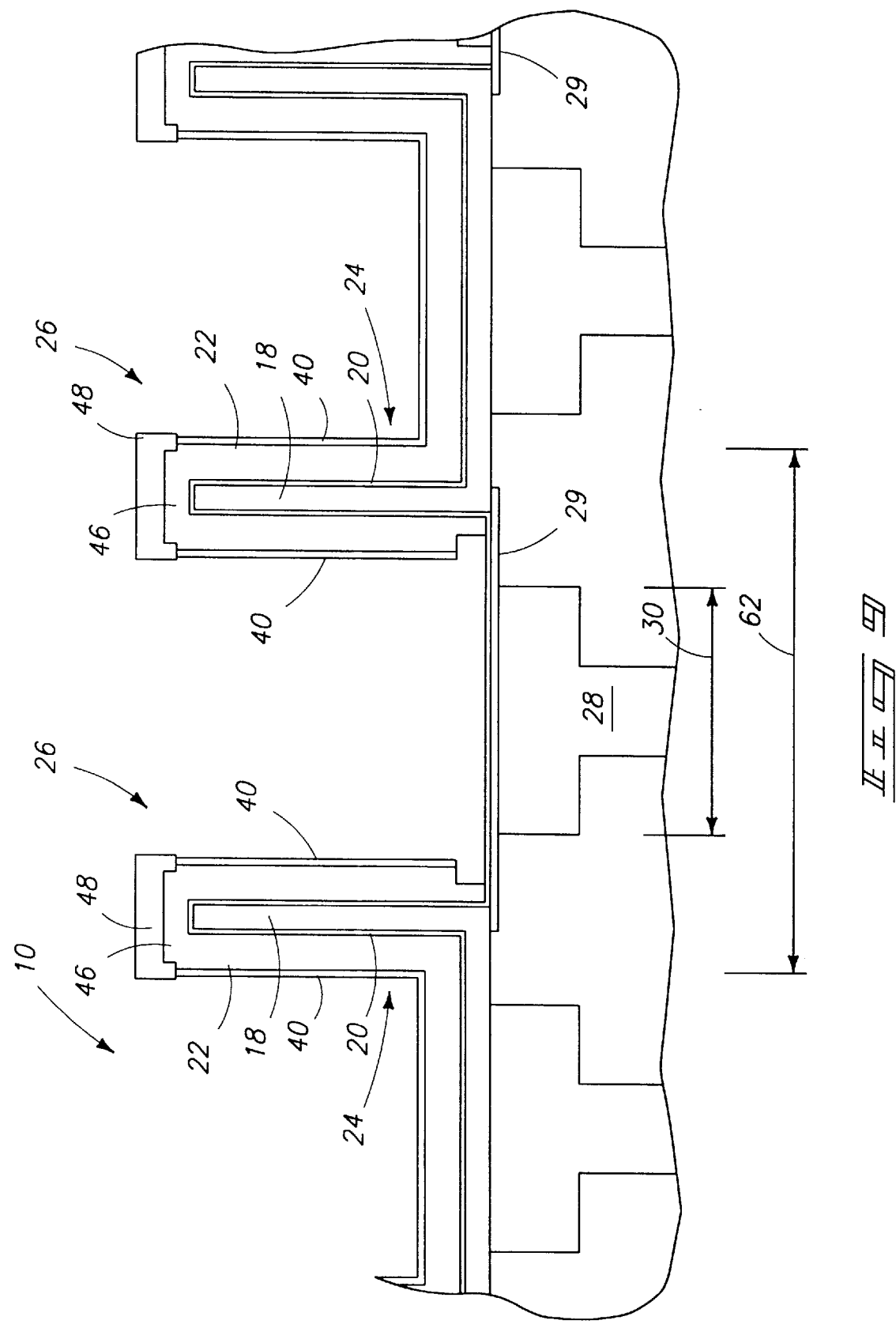
FIG. 11 is a diagrammatic section of that shown in FIG. 1, and which illustrates a processing step subsequent to that shown by FIG. 10.

Referring to FIG. 11, a filling dielectric layer 72 of a second dielectric material is provided over the conformal dielectric layer 70. The second dielectric material is selectively etchable relative to the first dielectric material, preferably comprising BPSG. Following deposit, the second dielectric layer 72 is planarized back by CMP to that shown in FIG. 11.

Figure 12:
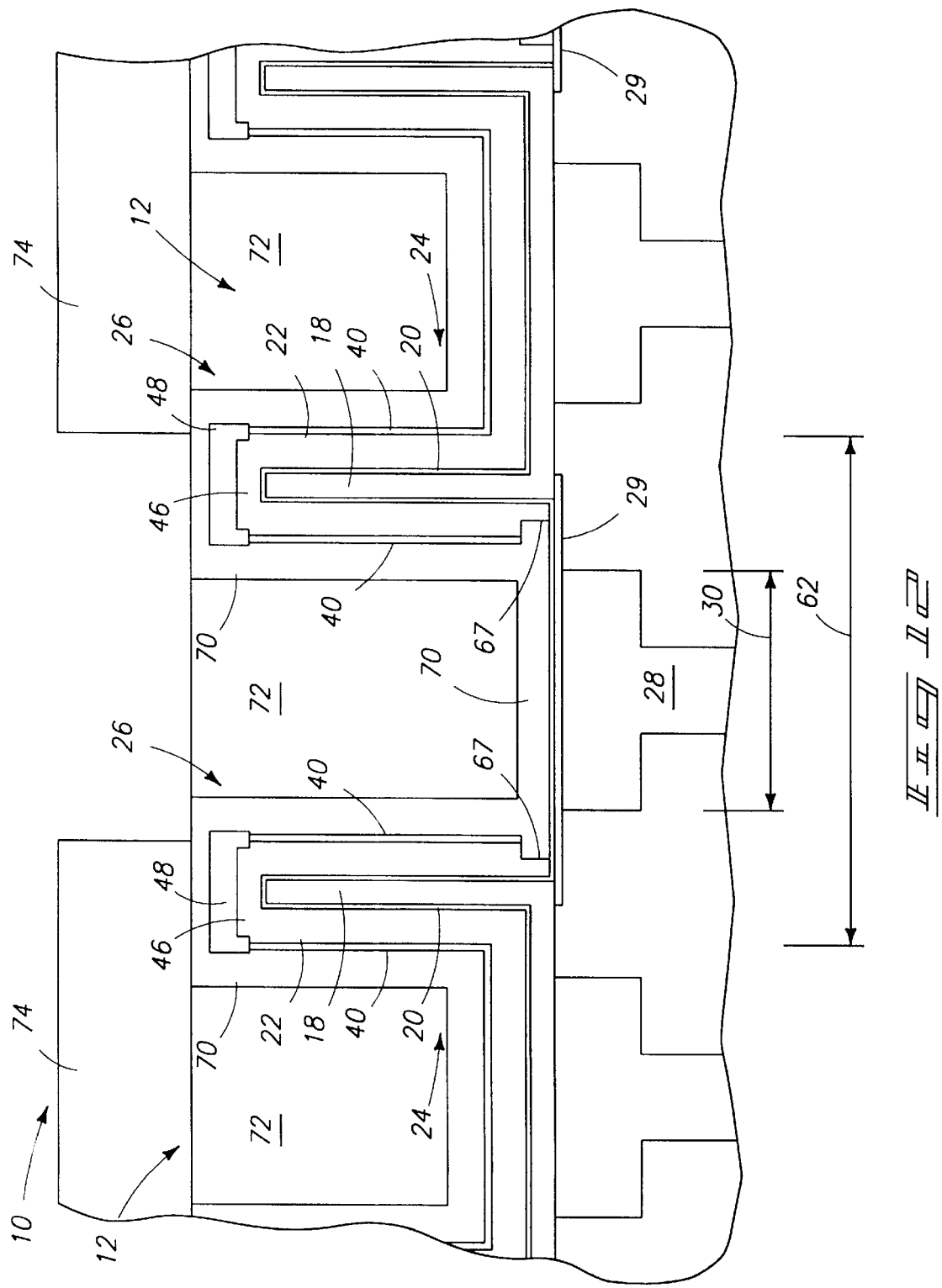
FIG. 12 is a diagrammatic section of that shown in FIG. 1, and which illustrates a processing step subsequent to that shown in FIG. 11.
Figure 11:
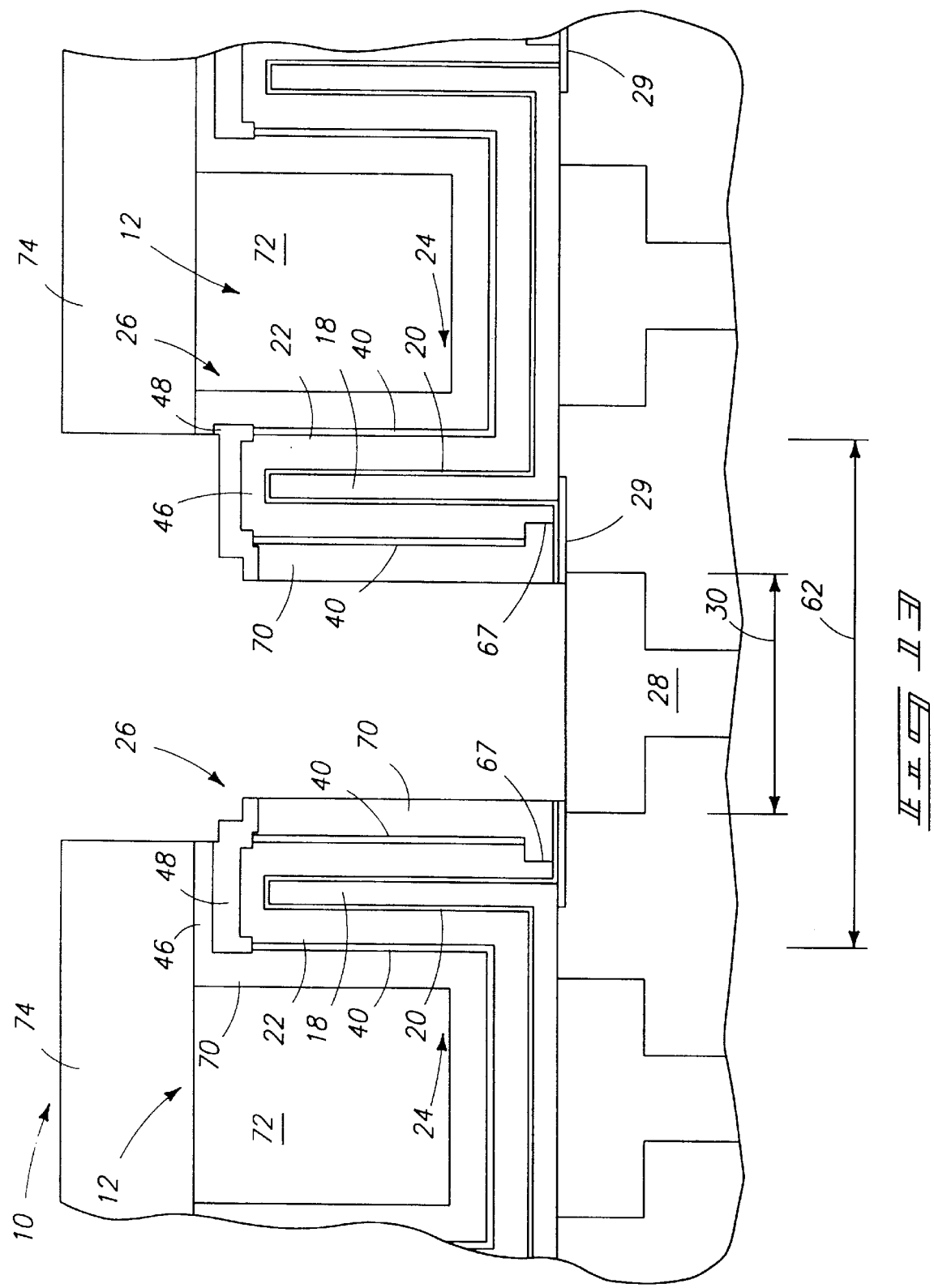

As best seen in FIG. 12, a third masking layer 74 of photoresist is applied in a predetermined pattern to the semiconductor wafer 10 to mask the capacitor, and outwardly expose the area between the capacitors 12. Oxide caps 48 again define the given target area 62 for the photoresistent opening which is larger than what would otherwise exist if the oxide caps were not present.

Referring to FIG. 13, the present method includes removing material 72 from within the target area 62 and thereby exposing the node 28. In particular, this step includes the selective etching of the first and second dielectric materials 70 and 72 from the target area 62, and thus outwardly exposing the node 28 while leaving the first dielectric material 72 in covering relation relative to the recessed portion 67 of cell polysilicon 22 of the adjacent capacitors 12. The etching chemistry employed to etch the BPSG is initially chosen to etch BPSG highly selective to nitride, with an example chemistry being $CHF_3$, $CF_4$, $CH_2F_2$ and argon combination. Subsequently, the etch chemistry is changed to etch silicon nitride highly selective to oxide, with an example chemistry being a $Cl_2$ and HBr mixture. Such etching also has the effect of etching into the oxide caps 48, but not sufficiently to expose the polysilicon portions 46.

Following this step of exposing the underlying node 28, an electrically conductive material 76 is deposited within the target area 62 where it comes into electrical contact with the node 28. This is shown most clearly by reference to FIG. 14.

As is clear from the study of the attached drawings, the described method has the advantage of allowing much simpler isolation of the bit contact and further provides a target area for the etch between adjacent components which is greater from what has been available heretofore.

The present invention has been described in language which is more or less specific as to structural and methodical features. It is to be understood, however, that the invention is not limited to the specific features described since the means disclosed herein comprise preferred forms of putting the invention in effect. The invention is therefore claimed in any of its forms or modifications within the proper scope of the appendant claims which are appropriately interpreted in accordance with the doctrine of equivalents.

What is claimed is:

1. A method of forming a contact proximate an electrical component, comprising:

providing an electrical component and a node on a substrate, the node being proximate the electrical component and covered by a first material, the electrical component comprising silicon and comprising an outer surface;

thermally oxidizing the outer surface to grow silicon dioxide from the outer surface;

exposing the silicon dioxide and the first material to etching conditions which remove the first material from over the node to expose the node and leaves the silicon dioxide over the outer surface; and providing an electrically conductive material in electrical contact with the exposed node.

2. The method of claim 1 wherein the electrical component comprises a pillar shape having sidewalls and an uppermost surface, the method further comprising protecting a major portion of the sidewalls during the thermally oxidizing, the silicon dioxide growing at the uppermost surface of the electrical component and at an unprotected minor portion of the sidewalls.

3. A method of forming a contact between two electrical components, comprising:

providing a pair of electrical components and a node on a substrate, the electrical components being spaced from one another and the node being between the electrical components, the node being covered by a layer of a first material comprising part of the electrical components;

forming masking cap material over the first material and over outer portions of the individual electrical components;

while keeping the masking cap material over the outer portions of the electrical components, removing the first material from over the node s to expose the nodes, wherein a target area for the removal includes some of the masking cap material without exposing the electrical components; and providing an electrically conductive material in electrical contact with the exposed node.

4. The method of claim 3 wherein the forming masking cap material comprises thermal oxidation of outer portions of the individual electrical components.

5. A method of forming a contact between two electrical components, comprising:

providing a pair of electrical components and a node on a substrate, the electrical components being spaced from one another and the node being between the electrical components, the node being covered by a layer of a material comprising part of the electrical components;

forming masking caps over the material and on outer portions of the individual electrical components, the material being selectively etchable relative to the masking caps;

selectively removing the material from over the node to expose the node, wherein a target area for the removal includes some of the masking caps;

during the selectively removing, protecting the electrical components from the selective removal conditions with the masking caps, the selective removal of material exposing the underlying node; and providing an electrically conductive material in electrical contact with the exposed node.

6. The method of claim 5 wherein the masking caps comprise silicon dioxide.

7. The method of claim 5 wherein the masking caps comprise silicon dioxide, wherein the material comprises silicon nitride, and wherein the selective removal comprises an etch with a mixture of $Cl_2$ and HBr.

8. A method of forming a contact between two adjacent capacitors, comprising:

providing a node between two adjacent capacitors; the adjacent capacitors being in spaced relationship one to another and being a first capacitor and a second capacitor; the first capacitor comprising a first pillar and the second capacitor comprising a second pillar; the first and second pillars comprising first and second storage node layers, cell dielectric layers and cell conductive layers, respectively; the storage node layers within the pillars having uppermost surfaces at an elevational level;

providing a material over the node and between the adjacent capacitors;

forming separate etch resistant masking caps atop the first and second pillars, the etch resistant masking caps not extending to beneath the elevational level of the storage node layers;

removing the material from over the node to expose the node; and providing an electrically conductive material in electrical contact with the exposed node.

9. The method of claim 8 wherein the masking caps comprise silicon dioxide.

10. The method of claim 8 wherein the masking caps comprise silicon dioxide, wherein the cell conductive layers of the pillars comprise silicon, and wherein the forming the masking caps comprises oxidizing the silicon of the cell conductive layers.

11. The method of claim 8 wherein the masking caps comprise silicon dioxide, wherein the material comprises silicon nitride, and wherein the selective removal comprises an etch with a mixture of $Cl_2$ and HBr.

12. A method for forming a bit line contact comprising:
providing a bit node and a pair of capacitors over a substrate, the bit node being between the pair of capacitors and being covered by a material; the capacitors being a first capacitor and a second capacitor, the first capacitor comprising two pillars and the second capacitor comprising two pillars, the pillars comprising a storage node layers, cell dielectric layers and cell conductive layers;
forming masking caps on each of the pillars, the masking caps being separated from one another and being selectively etchable relative to the material over the bit node;
selectively removing the material from over the bit node to expose the bit node;
during the selectively removing, protecting the capacitors from the selective removal conditions with the caps, the selective removal of material exposing the bit node; and
providing an electrically conductive material in electrical contact with the exposed bit node to form a bit line contact between the capacitors.

13. The method of claim 12 wherein the storage node layers of the pillars comprise uppermost surfaces at elevational levels, and wherein the masking caps associated with individual pillars do not extending to beneath the elevational levels of the storage node layers associated with the individual pillars.

14. The method of claim 12 wherein the storage node layers of the pillars comprise uppermost surfaces at a common elevational level, and wherein the masking caps do not extending to beneath the common elevational level.

15. The method of claim 12 wherein the masking caps comprise silicon dioxide.

16. The method of claim 12 wherein the masking caps comprise silicon dioxide, wherein the cell conductive layers of the pillars comprise silicon, and wherein the forming the masking caps comprises oxidizing the silicon of the cell conductive layers.

17. The method of claim 12 wherein the masking caps comprise silicon dioxide, wherein the material comprises silicon nitride, and wherein the selective removal comprises an etch with a mixture of $Cl_2$ and HBr.

18. A method for forming a bit line contact comprising the following steps:
providing a bit node to which electrical connection is desired;
providing a pair of adjacent capacitors which are disposed in spaced relationship one to another; the capacitors respectively comprising a storage node layer, a cell dielectric layer and a cell conductive layer; the individual capacitor layers defining a least two adjacent and upwardly projecting pillars each having an uppermost portion; one pillar being associated with one capacitor, and the other pillar being associated with the other capacitor; the cell conductive layer being common to the pair of capacitors and extending therebetween; and the bit node being positioned between the capacitors; the storage node layer having a lowest elevational level and the bit node comprising a conductive material beneath the lowest elevational level of the storage node layer;
providing an oxidation barrier layer over the cell conductive layer;
providing a first masking layer over the oxidation barrier layer and thereafter removing only a portion of the first masking layer to expose the oxidation barrier layer on the uppermost portions of the two pillars;
removing the exposed oxidation barrier layer from the uppermost portions of the pillars to expose the underlying cell conductive layer on the uppermost portions of the pillars;
removing the first masking layer;
subjecting the exposed cell conductive layer to oxidation conditions effective to grow an oxide cap on each of the pillars;
providing a second masking layer to mask the capacitors and outwardly expose an area between the pillars on the adjacent capacitors, the oxide caps defining a given target area which is larger than would otherwise exist if the oxide caps were not present, the target area including the area between the individual pillars;
etching the oxidation barrier layer from within the target area;
etching the cell conductive layer within the target area and leaving the cell conductive layer material within the given target area outwardly exposed;
removing the second masking layer;
providing a conformal dielectric layer of a first dielectric material over the exposed conductive layer which is located within the target area;
providing a filling dielectric layer of a second dielectric material over the conformal dielectric layer, the second dielectric material being selectively etchable relative to the first dielectric material;
providing a third masking layer to mask the capacitors and outwardly expose the area between the capacitors, the oxide caps defining the given target area which is larger than would otherwise exist if the oxide caps were not present;
removing the first and second dielectric materials from within the target area to effectively outwardly expose the bit node while leaving the first dielectric material in covering relation relative to the cell conductive layer of the adjacent capacitors within the target area; and
providing an electrically conductive material within the target area and which is in electrical contact with the bit node.

19. A method as claimed in claim 18, wherein the oxidation barrier layer is composed of silicon nitride which is deposited to a thickness of greater than about 100 Angstroms.

20. A method as claimed in claim 18, wherein the first, second and third masking layers comprise photoresist.

21. A method as claimed in claim 18, wherein the oxidation barrier layer is removed by an isotropic etch.

22. A method as claimed in claim 18, wherein the oxide caps are grown to a thickness of at least 500 Angstroms.

23. A method as claimed in claim 18, wherein the etch of the cell conductive layer in the target area includes an anisotropic etch followed by an isotropic etch.

24. A method as claimed in claim 18, wherein the first dielectric layer is silicon nitride which is deposited to a thickness of about 300 to about 1,000 Angstroms.

25. A method as claimed in claim 18, wherein the step of etching the oxidation barrier from within the target area includes the use of an etching chemistry which selectively etches the oxidation barrier layer relative to the oxide caps at a ratio of at least 5:1.

26. A method as claimed in claim 18, wherein the step of etching the cell conductive layer from within the target area includes the use of an etching chemistry which selectively etches the cell conductive layer relative to the oxidation barrier layer at a ratio of at least 10:1.

27. A method as claimed in claim 18, wherein the conformal dielectric material is silicon nitride, and the filling dielectric material is BPSG, and wherein the chemistry employed to etch the BPSG and silicon nitride from within the target area lias a high selectivity for BPSG and silicon nitride, and wherein the etching chemistry further selectively etches the silicon nitride relative to the oxide caps at a ratio of at least 7:1.

* * * * *

UNITED STATES PATENT AND TRADEMARK OFFICE
CERTIFICATE OF CORRECTION

PATENT NO.   : 6,100,156
DATED        : August 8, 2000
INVENTOR(S)  : Pai-Hung Pan; Thomas Arthur Figura It is certified that error appears in the above-identified patent and that said Letters Patent is hereby corrected as shown below:

Column 6,
Line 10, replace "node s" with -- node --
Line 10, replace "nodes," with -- node, --

Column 10,
Line 8, replace "lias" with -- has --

Signed and Sealed this

Twenty-fifth Day of December, 2001

Attest:

JAMES E. ROGAN
*Attesting Officer*  *Director of the United States Patent and Trademark Office*